(12) United States Patent
Chen et al.

(10) Patent No.: US 11,887,646 B2
(45) Date of Patent: Jan. 30, 2024

(54) CAPACITOR STRUCTURE AND METHOD OF FORMING THE SAME

(71) Applicant: Yangtze Memory Technologies Co., Ltd., Hubei (CN)

(72) Inventors: Liang Chen, Wuhan (CN); Cheng Gan, Wuhan (CN); Xin Wu, Wuhan (CN); Wei Liu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 256 days.

(21) Appl. No.: 17/453,919

(22) Filed: Nov. 8, 2021

(65) Prior Publication Data
US 2022/0059152 A1 Feb. 24, 2022

Related U.S. Application Data

(60) Division of application No. 16/367,298, filed on Mar. 28, 2019, now Pat. No. 11,232,825, which is a
(Continued)

(51) Int. Cl.
*G11C 11/24* (2006.01)
*G11C 11/404* (2006.01)
(Continued)

(52) U.S. Cl.
CPC ............ *G11C 11/24* (2013.01); *G11C 11/404* (2013.01); *H01L 28/40* (2013.01); *H10B 12/395* (2023.02)

(58) Field of Classification Search
CPC ....... G11C 11/24; G11C 11/404; G11C 5/145; H01L 28/40; H01L 28/60; H10B 12/395
See application file for complete search history.

(56) References Cited

U.S. PATENT DOCUMENTS 7,964,972 B2   6/2011   Matsui
8,390,098 B2   3/2013   Matsui
(Continued)

FOREIGN PATENT DOCUMENTS

CN   105552021 A     5/2016
JP   2000-349044 A   12/2000
(Continued)

OTHER PUBLICATIONS

International Search Report and Written Opinion of the International Searching Authority dated Nov. 21, 2019, in PCT/CN2019/075366, 9 pages.
(Continued)

*Primary Examiner* — Matthew C Landau
*Assistant Examiner* — Dmitriy Yemelyanov
(74) *Attorney, Agent, or Firm* — Oblon, McClelland, Maier & Neustadt, L.L.P.

(57) ABSTRACT

In a method for manufacturing a semiconductor device, a doped region is formed in a substrate from a first main surface. An insulating layer is formed over the doped region of the substrate. Contacts are formed in the insulating layer such that the contacts extend into the doped region. A portion of the substrate is removed from a second main surface. A trench, a first conductive line, and a second conductive line are formed from the doped region of the substrate through etching the substrate from the second main surface. The trench extends through the substrate to expose the insulating layer. The first and second conductive lines are spaced apart from each other by the trench. The contacts are positioned along and in contact with the first and second conductive lines. The trench is filled with a dielectric material.

20 Claims, 10 Drawing Sheets

Related U.S. Application Data continuation of application No. PCT/CN2019/075366, filed on Feb. 18, 2019.

(51) Int. Cl.
  *H01L 49/02* (2006.01)
  *H10B 12/00* (2023.01)

(56) References Cited

U.S. PATENT DOCUMENTS

| | | |
|---|---|---|
| 2006/0001174 A1 | 1/2006 | Matsui |
| 2008/0173977 A1 | 7/2008 | Chinthakindi et al. |
| 2009/0288869 A1 | 11/2009 | Anderson |
| 2010/0032799 A1 | 2/2010 | Bartley |
| 2010/0061035 A1 | 3/2010 | Kitamura et al. |
| 2011/0018096 A1 | 1/2011 | Izumi |
| 2011/0210426 A1 | 9/2011 | Matsui |
| 2011/0219876 A1 | 9/2011 | Kalnitsky |
| 2011/0298085 A1 | 12/2011 | Terletzki |
| 2012/0056255 A1* | 3/2012 | Sukekawa ............ H10B 12/053 257/329 |
| 2013/0127013 A1 | 5/2013 | Park |
| 2017/0040255 A1 | 2/2017 | Lee et al. |
| 2018/0076277 A1* | 3/2018 | Hu .................... H01L 21/26513 |
| 2020/0203357 A1* | 6/2020 | Chhajed ................ H10B 53/30 |

FOREIGN PATENT DOCUMENTS

| | | |
|---|---|---|
| JP | 2006-19455 A | 1/2006 |
| JP | 2009-70969 A | 4/2009 |
| WO | WO 2015/099668 A1 | 7/2015 |

OTHER PUBLICATIONS

Chinese Office Action dated Nov. 24, 2020 in Patent Application No. 201980000366.X, 5 pages.

Japanese Office Action dated Jul. 19, 2022 in Japanese Patent Application No. 2021-530953, 5 pages.

Supplementary European Search Report dated Apr. 19, 2022 in European Patent Application No. 19 915 921.1, 67 pages.

* cited by examiner

US 11,887,646 B2

CAPACITOR STRUCTURE AND METHOD OF FORMING THE SAME

RELATED APPLICATION

This application is a divisional of U.S. patent application Ser. No. 16/367,298 filed on Mar. 28, 2019, which is a continuation of International Application No. PCT/CN2019/075366, filed on Feb. 18, 2019. The entire contents of the above-identified applications are incorporated herein by reference in their entirety.

BACKGROUND

A capacitor is widely used in an integrated circuit. The capacitor can store and release electric energy and function as a voltage booster or a power stabilizer in the integrated circuit. In current three dimensional (3D)-NAND technology, a plurality of capacitors can be applied to serve as voltage boosters to provide high voltages during the operation of 3D-NAND memory cells.

Capacitor structures for deep sub-micron CMOS can be constructed with two flat parallel plates separated by a thin dielectric layer. The plates are formed by layers of conductive material, such as metal or polysilicon. The capacitor structure is usually isolated from the substrate by an underlying dielectric layer. To achieve high capacitance density in these structures, additional chip areas are required to introduce extra plates. As critical dimensions of 3D-NAND devices in integrated circuits shrink to achieve greater storage capacity, the capacitor structures cannot meet the scaling requirement that requires smaller dimension and higher capacitance density.

SUMMARY

The inventive concepts relate to a novel capacitor structure, and more particularly, to a vertical-type capacitor structure in which the plates extend from a top surface of a substrate to an opposing bottom surface of the substrate. In addition. The plates are concentrically disposed in the substrate to achieve high capacitance density in a reduced chip area to meet the scaling requirement.

As 3D NAND technology migrates towards high density and high capacity, especially from 64 L to 128 L architecture, the number of devices, the number of metal lines has increased significantly, and the chip area has remained basically unchanged. So the space for introducing other electronic components, such as capacitors and bond pads, is getting smaller and smaller. Metal-oxide-silicon (MOS)/metal-oxide-metal (MOM) capacitors typically require a large silicon area. Moreover, a large MOS capacitor area could increase the time-dependent dielectric breakdown (TDDB) failure rate. Therefore, a new capacitor structure is needed to meet the circuit requirements (e.g., high capacitance density) without occupying too much space.

In the present disclosure, a novel capacitor structure is introduced. According to an aspect of the disclosure, an integrated circuit (IC) chip is provided. The IC chip includes a substrate that has opposing first and second main surfaces. A plurality of transistors are formed at a first location in the first main surface of the substrate and a capacitor is formed at a second location of the substrate. The capacitor further includes a first conductive plate that is formed in the substrate and extends from the first main surface to the second main surface of the substrate, a second conductive plate that is formed in the substrate and extends from the first main surface to the second main surface, and an insulating structure that is formed between the first conductive plate and the second conductive plate and extends from the first main surface to the second main surface.

In some embodiments, the first conductive plate, the second conductive plate, and the insulating structure are close-shaped (such as ring-shaped) and are concentrically arranged in the substrate so that the insulating structure is disposed between the first plate and the second plate. For example, the first conductive plate, the second conductive plate, and the insulating structure can be concentrically arranged in the substrate and have a square profile, a circle profile, a triangle profile, a rectangle profile, an oval profile, a diamond profile, an trapezium profile, a pentagon profile, a hexagon profile, a parallelogram profile, or a star profile.

In an embodiment, the first conductive plate and the second conductive plates are made of doped silicon or metal. The first conductive plate can be electrically coupled with a first polarity, and the second conductive plate can be electrically coupled with a second polarity.

The capacitor structure of the disclosure can further include a dielectric layer formed over the first main surface of the substrate and a plurality of contacts formed in the insulating layer. The plurality of contacts can extend into the first and second conductive plates and be electrically coupled with the first and second conductive plates.

According to another aspect of the disclosure, a method for manufacturing the capacitor structure is provided. In the disclosed method, a doped region is formed in a substrate from a first main surface. An insulating layer is formed over the doped region of the substrate. A plurality of contacts are formed in the insulating layer. The plurality of contacts further extend into the doped region. Subsequently, a portion of the substrate is removed from a second main surface of the substrate. A plurality of trenches and conductive lines are created in the doped region of the substrate through etching the substrate from the second main surface on which a patterned mask is formed. The trenches pass through the substrate to expose the insulating layer, the conductive lines are spaced apart from each other by the trenches, and the contacts are in direct contact with the conductive lines. The plurality of trenches are subsequently filled with a dielectric material.

According to yet another aspect of the disclosure, a semiconductor device is provided. The semiconductor device can include a substrate that has opposing first and second main surfaces. A memory cell region is formed in the first main surface of the substrate, and a capacitor structure is formed adjacent to the memory cell region. The capacitor structure includes a first conductive plate in the substrate that extends from the first main surface to the second main surface, a second conductive plate in the substrate that extends from the first main surface to the second main surface, and an isolation structure that is disposed between the first conductive plate and the second conductive plate and extends from the first main surface to the second main surface.

In some embodiments, the memory cell region of the semiconductor device disclosed in the present disclosure includes a DRAM memory cell, a NAND memory cell, a three dimensional NAND memory cell, a phase change memory cell, or a magnetoresistive random-access memory (MRAM) cell.

According to the disclosure, a vertical-style capacitor structure can be formed in the substrate. The capacitor structure has a silicon-dielectric-silicon configuration where the plates of the capacitor structure are made of portions of substrate. The capacitor structure can be formed in a spare area of the silicon substrate. The plates of the capacitor structure extend from a top surface to a bottom surface of the substrate, and have a concentric profile that provides high capacitance density. The plates of the capacitor structure are spaced apart by an insulating structure that extends from the top surface to the bottom surface of the substrate. The insulating structure further separates the capacitor structure and adjacent active memory cells from any electrical interference. The capacitor structure of the present disclosure provides high capacitance density, occupies less chip area, prevents electric failure, and meets the scaling requirement.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
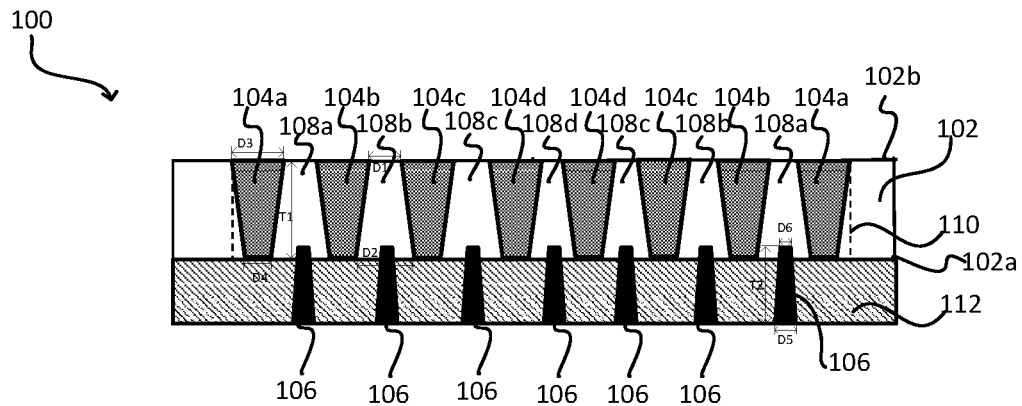
FIG. 1A is a cross-sectional view of a capacitor structure, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
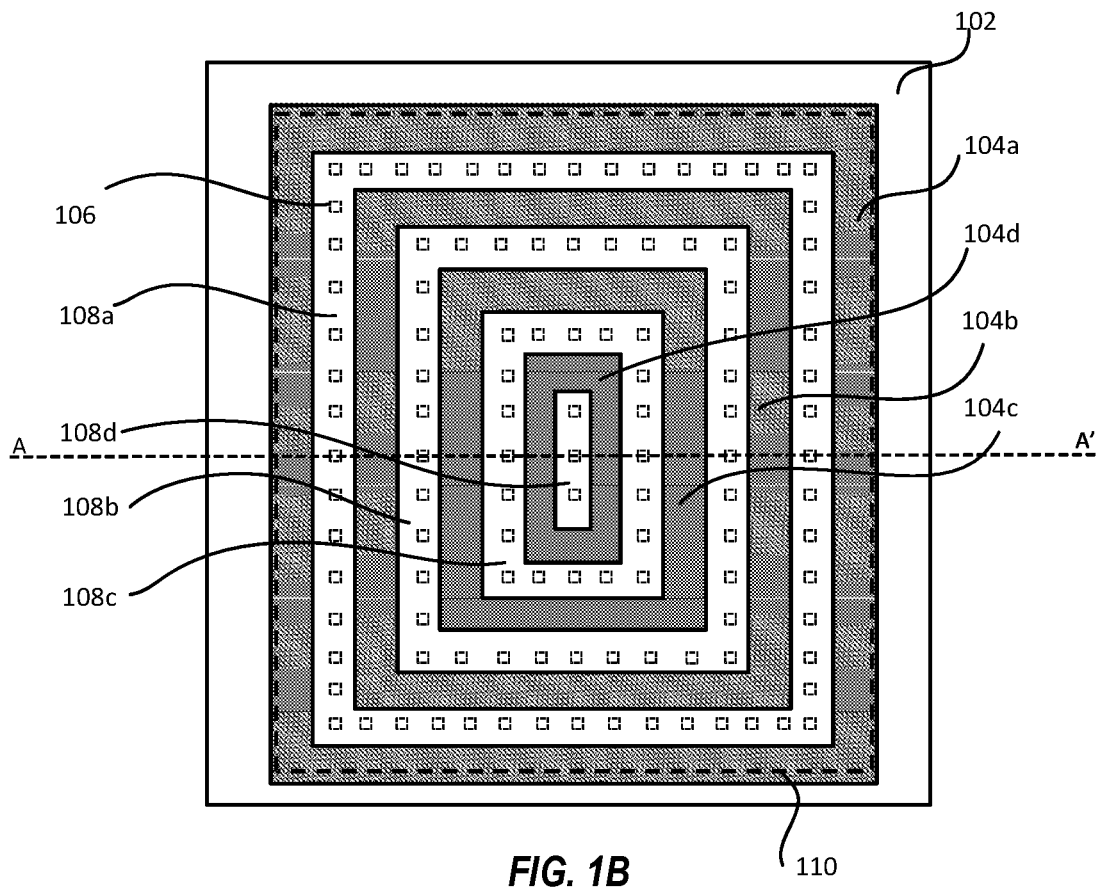
FIG. 1B is a top down view of the capacitor structure, in accordance with exemplary embodiments of the disclosure.

FIG. 1A is a cross-sectional view of a capacitor structure 100, and FIG. 1B is a top down view of the capacitor structure 100. The cross-sectional view of the capacitor structure 100 in FIG. 1A is obtained from a plane same as the vertical plane containing line A-A' in FIG. 1B.

As shown, the capacitor structure 100 includes a substrate 102 having a top surface (or first main surface) 102a and a bottom surface (or second main surface) 102b. The capacitor structure 100 can further include a plurality of first conductive plates and a plurality of second conductive plates that are formed in the substrate 102, and extend from the top surface 102a to the bottom surface 102b. For example, two first conductive plates 108a/108c, and two second conductive palates 108b/108d are included in the capacitor structure 100 as shown in FIGS. 1A/1B. It should be noted that FIGS. 1A and 1B are merely examples, and the capacitor structure 100 can include more than two first conductive plates, and more than two second conductive plates based on technology requirements. The first and second conductive plates can have a top critical dimension (CD) CD1, a bottom CD CD2, and a height T1. The CD1 and CD2 are defined based on the desired capacitance value and larger than 120 nm. The T1 can be in a range from 2 um to 3 um.

In FIG. 1, the first conductive plates 108a/108c and the second conductive plates 108b/108d are shown as close-shaped (such as ring-shaped) and concentrically arranged in the substrate 102. The first conductive plates 108a/108c and the second conductive plates 108b/108d are alternatively disposed and spaced apart by a plurality of insulating structure 104a-104d. In alternative embodiments, the first conductive plate, the second conductive plate, and the insulating structure can be concentrically arranged in the substrate and have a square profile, a circle profile, a triangle profile, a rectangle profile, an oval profile, a diamond profile, an trapezium profile, a pentagon profile, a hexagon profile, a parallelogram profile, or a star profile.

The substrate 102 may include a silicon (Si) substrate, a germanium (Ge) substrate, a silicon germanium (SiGe) substrate, and/or a silicon-on-insulator (SOI) substrate. The substrate 102 may include a semiconductor material, for example, a Group IV semiconductor, a Group III-V compound semiconductor, or a Group II-VI oxide semiconductor. In an embodiment of FIG. 1, the substrate 102 is a Group IV semiconductor that may include Si, Ge, or SiGe. The substrate 102 may be a bulk wafer or an epitaxial layer.

The first conductive plates 108a/108c and the second conductive plates 108b/108d can be silicon doped with P-type dopant via an ion implantation process. For example, the first conductive plates 108a/108c and the second conductive plates 108b/108d can be doped with boron at a dopant concentration from $4e15$ $cm^{-3}$ to $8e15$ $cm^{-3}$. In another example, the first conductive plates 108a/108c and the second conductive plates 108b/108d can be silicon doped with N-type dopant via the ion implantation, such as doping Arsenic with a dopant concentration from $5e15$ $cm^{-3}$ to $8e15$ $cm^{-3}$. As shown in FIGS. 1A/1B, a dopant region 110 can be formed during the ion implantation in the substrate 102. In yet another example, the first and second conductive plates can be made of metal, such as tungsten, copper or aluminum. The first conductive plates can be electrically coupled with a first polarity, and the second conductive plates can be electrically coupled with a second polarity. In some examples, the first polarity is positive and the second polarity is negative. In other examples, the first polarity is negative and the second polarity is positive depending on the circuit requirements.

Still referring to FIGS. 1A and 1B, the insulating structures 104 extend from the top surface 102a to the bottom surface 102b of the substrate 102. The insulating structures 104 can also be ring-shaped and concentrically arranged in the substrate 102. The insulating structures 104 are disposed between the first plates 108a/108c and the second plates 108b/108d and function as insulating layers of capacitors. The insulating structures 104 can be made of SiO, SiN, SiC, SiON, SiOC, SiCN, SiOCN, AlO, AlON, ZrO, or high K material. The insulating structures 104 can have a top critical dimension (CD) D3 in a range from 160 nm to 210 nm, a bottom CD D4 between 140 nm and 180 nm, and a height T1 between 2 um and 3 um.

Various capacitors can be formed based on the capacitor structure 100. For example, the first conductive plate 108a, the insulating structure 104b, and the second conductive plate 108b can form a first capacitor when the first conductive plate 108a is electrically coupled with the first polarity and the second conductive plate 108b is electrically coupled with the second polarity. Similarly, in another example, the first conductive plate 108c, the insulating structure 104d, and the second conductive plate 108d can form a second capacitor. In yet another example, the first conductive plate 108c, the insulating structure 104c, and the second conductive plate 108b can form a third capacitor, depending on the circuit requirements.

The capacitor structure 100 further includes a dielectric layer 112 formed over the top surface 102a of the substrate 102. The dielectric layer 112 can include SiO, SiN, SiC, SiON, SiOC, SiCN, SiOCN, AlO, AlON, ZrO, or high K material. The dielectric layer 112 can have a thickness in a range from 5 um to 6 um. A plurality of contacts 106 can further be formed in the dielectric layer 112 and extend into the first and second conductive plates 108. The contacts 106 can have a top CD D5 in a range from 250 nm to 300 nm, a bottom CD D6 in a range from 120 nm to 160 nm, and a height T2 between 4.5 um to 5 um. The contacts 106 can be made of tungsten, copper or aluminum. The contacts 106 can extend into the first and second conductive plates 108 with a depth between 20 nm and 50 nm and electrically coupled with the first and second conductive plates 108. It should be noted that the contacts 106 are drawn with dashed lines in FIG. 1B to indicate a perspective view of the contacts 106.

FIGS. 2A through 8B illustrate the intermediate stages in the formation of a capacitor structure 100. Each of the figure number of FIGS. 2A through 8B includes letter "A" and "B", where letter "A" indicates a cross-sectional view and "B" indicates a top down view. The cross-sectional view is obtained from a plane same as the vertical plane containing line A-A' in the top down view.

Figure 2A:
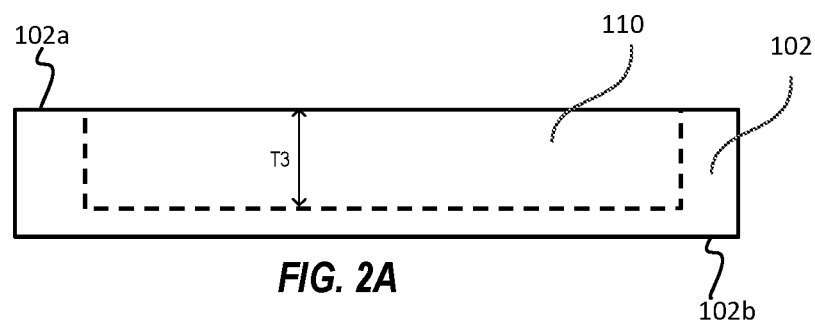
FIGS. 2A through 8B are cross-sectional and top down views of various intermediary steps of manufacturing a capacitor structure, in accordance with exemplary embodiments of the disclosure.
Figure 2B:
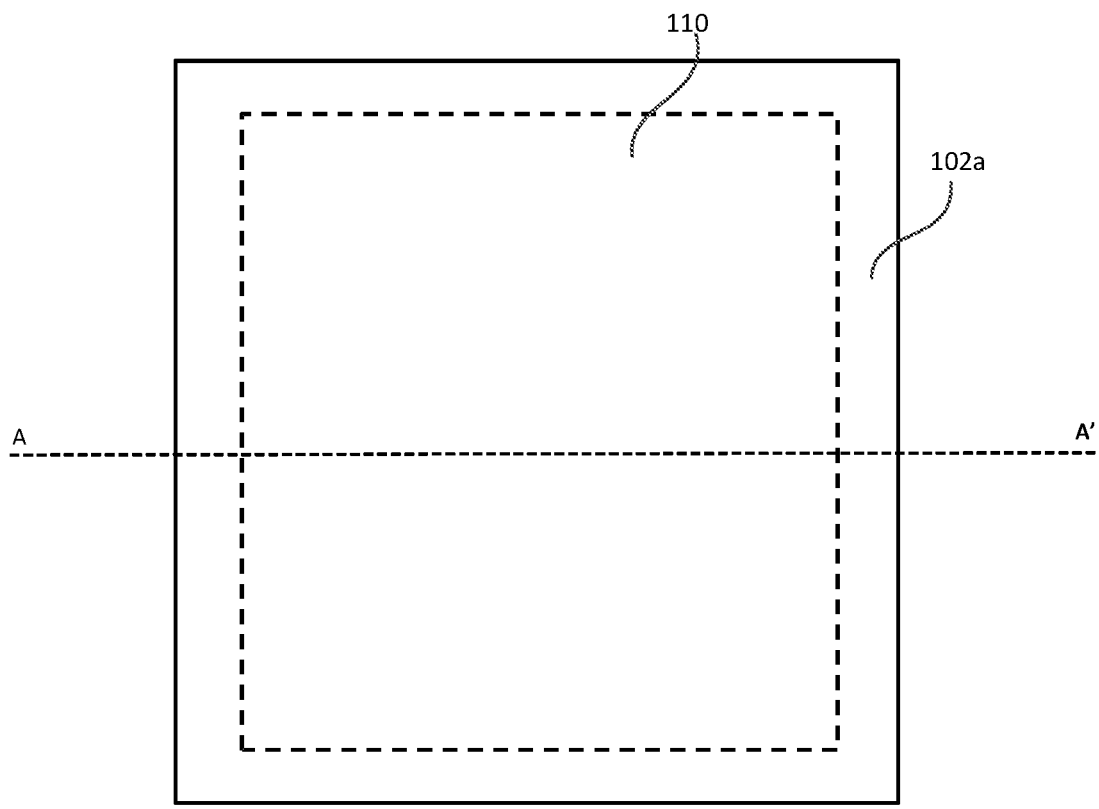

As shown in FIGS. 2A/2B, a substrate 102 is prepared. Subsequently, a doped region 110 is formed through an ion implantation process, an in situ doped epitaxial growth, a plasma doping process (PLAD), or other method as known in the art. In an embodiment, the doped region 110 can be doped with N-type dopant that includes arsenic, phosphorous, antimony, or other N-type donor material. In another embodiment, the doped region 110 can be doped with P-type dopant that includes boron, aluminum, gallium, indium, or other P-type acceptor material. The depth T3 of the doped region 110 can be in a range from 2 um to 10 um. In an embodiment of FIGS. 2A/2B, the doped region 110 is doped with boron and has a dopant concentration between 4e15 cm$^{-3}$ and 8e15 cm$^{-3}$.

The substrate 102 may include a silicon (Si) substrate, a germanium (Ge) substrate, a silicon germanium (SiGe) substrate, and/or a silicon-on-insulator (SOI) substrate. The substrate 102 may include a semiconductor material, for example, a Group IV semiconductor, a Group III-V compound semiconductor, or a Group II-VI oxide semiconductor. The substrate 102 may be a bulk wafer or an epitaxial layer. In the embodiment of FIGS. 2A/2B, substrate 102 is a Group IV semiconductor that may include Si, Ge, or SiGe.

Figure 3A:
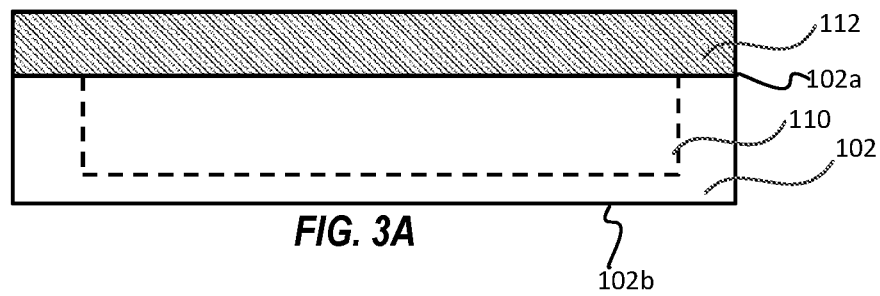
Figure 3B:
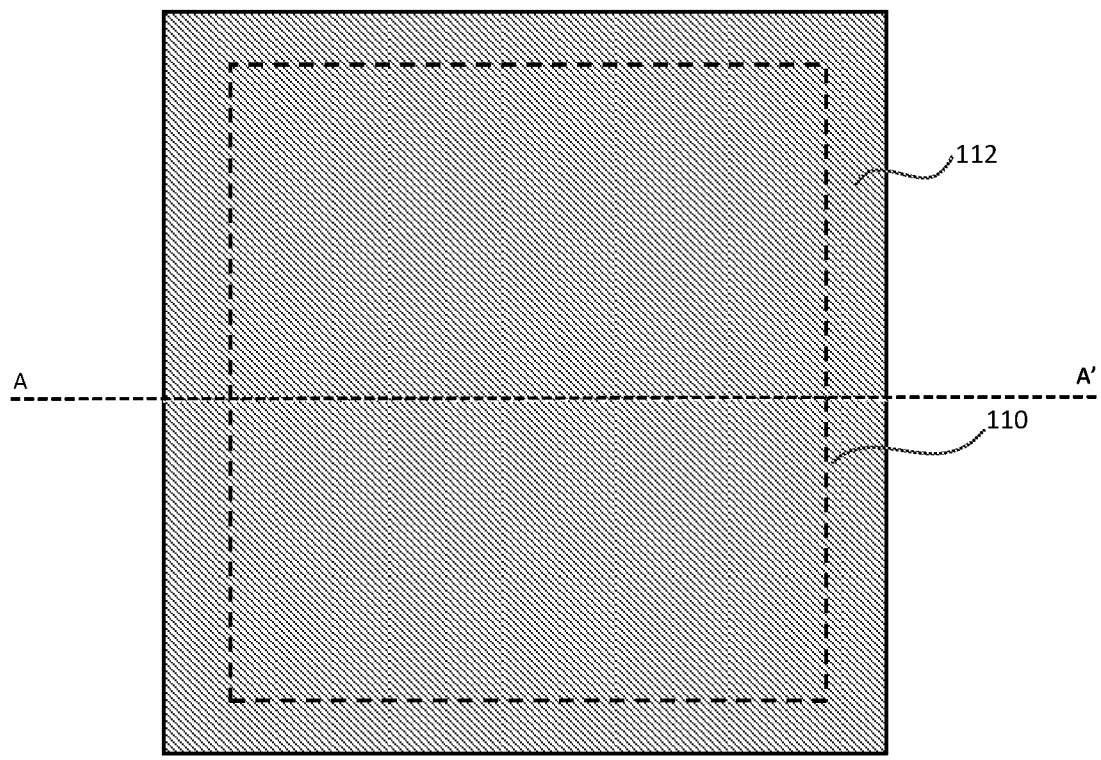

In FIGS. 3A/3B, a dielectric layer 112 formed over the top surface 102a of the substrate 102. The dielectric layer 112 can include SiO, SiN, SiC, SiON, SiOC, SiCN, SiOCN, AlO, AlON, ZrO, or high K material. The dielectric layer 112 can have a thickness in a range from 5 um to 6 um. Any suitable deposition process can be applied to form the dielectric layer 112, such as chemical vapor deposition (CVD), physical vapor deposition (PVD), atomic layer deposition (ALD), diffusion, or any combination thereof.

Figure 4A:
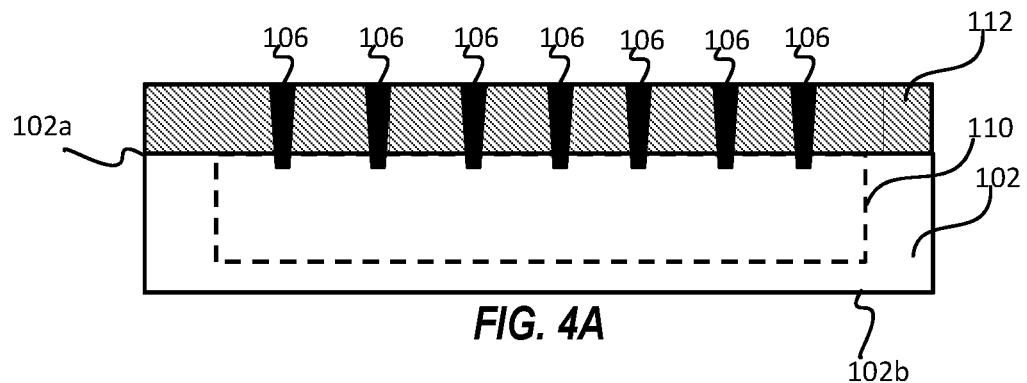
Figure 4B:
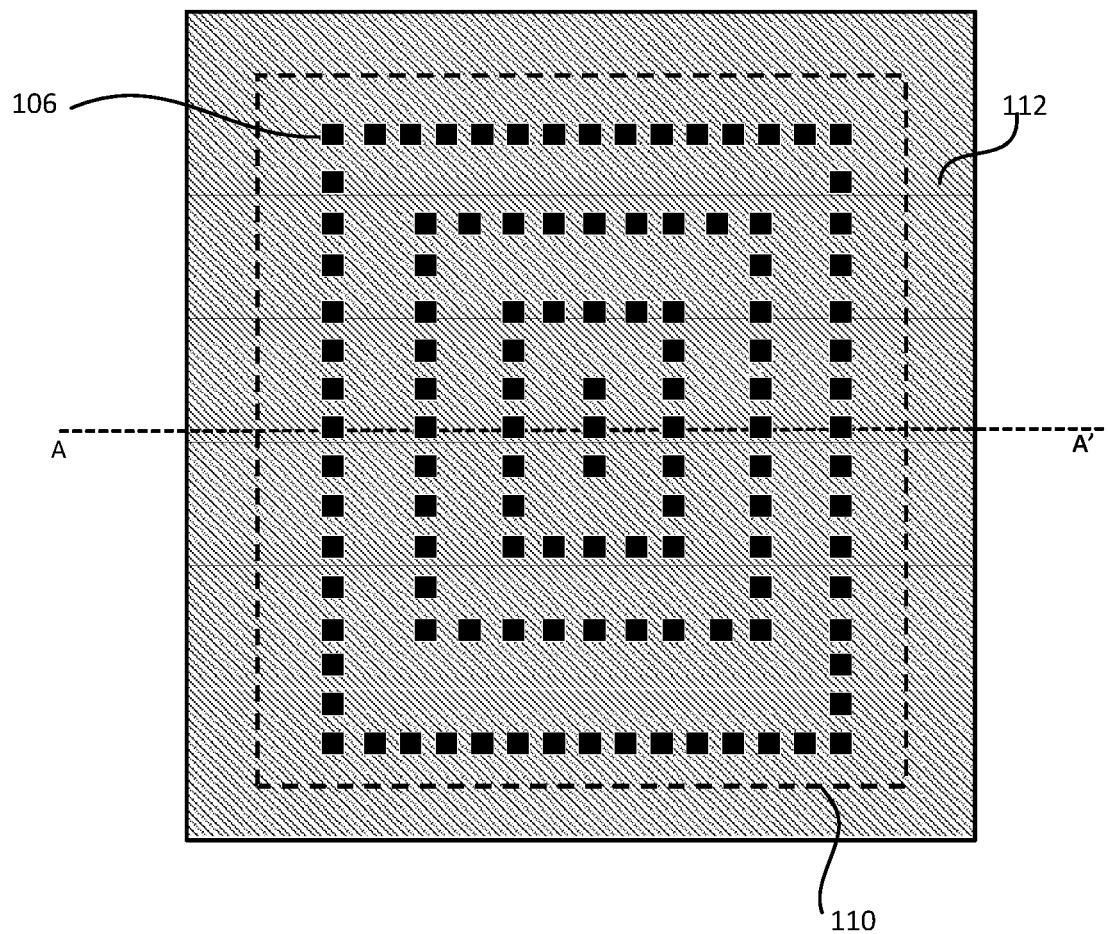

FIGS. 4A/4B illustrate that a plurality of contacts 106 are formed in the dielectric layer 112. In order to form the contacts 106, a patterned mask stack (not shown) can be formed over the dielectric layer 112. The mask stack can include one or more hard mask layers and a photoresist layer. The mask stack can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like. When the patterned mask stack is formed, an etching process, such as a wet etching or a dry etching, can be applied. The etching process etches through the dielectric layer 112 and transfers the patterns of the mask stack into the dielectric layer 112 to form a plurality of contact openings (not shown in FIGS. 4A/4B). The contact openings can have a tapered profile. The contact openings further extend into the substrate 102 by recessing a portion of the substrate with a depth between 20 nm and 50 nm. When the etching process is completed, a subsequent plasma ashing and a wet clean can be applied to remove the remaining mask stack. The contact openings can be ring-shaped and concentrically disposed in the doped region 110.

A conductive layer (not shown in FIGS. 4A/4B) can be formed in the contact openings. The conductive layer can further cover a top surface of the dielectric layer 112. The conductive layer may include cobalt (Co), tungsten (W), ruthenium (Ru), aluminum (Al), copper (Cu), or other suitable conductors, and be deposited by a suitable deposition process, such as chemical vapor deposition (CVD), physical vapor deposition (PVD), atomic layer deposition (ALD), sputtering, e-beam evaporation, or any combination thereof. Alternatively, the conductive layer may include copper (Cu), copper magnesium (CuMn), copper aluminum (CuAl), and the like, and an electro-chemical plating (ECP) process may be applied. In some embodiments, a barrier layer (not shown in FIGS. 4A/4B), such as Ti, TiN, Ta, TaN, or other suitable materials, is formed before the conductive layer. The barrier layer can be formed by using physical vapor deposition (PVD), CVD, ALD, or other well-known deposition techniques.

When the conductive layer is formed in the contact openings, a subsequent surface planarization process, such as a chemical mechanical polishing (CMP), is performed to remove excessive conductive layer over the top surface of dielectric layer 112, and the remaining conductive layer in the contact openings forms the contacts 106. As shown in FIGS. 4A/4B, the contacts 106 are ring-shaped and concentrically disposed in the doped region 110. The contacts 106 further extend into the doped region 110 with a depth of between 20 nm and 50 nm. The contacts 106 have a tapered profile with a top CD in a range from 250 nm to 300 nm, a bottom CD in a range from 120 nm to 160 nm, and a height between 4.5 um to 5 um.

Figure 5A:
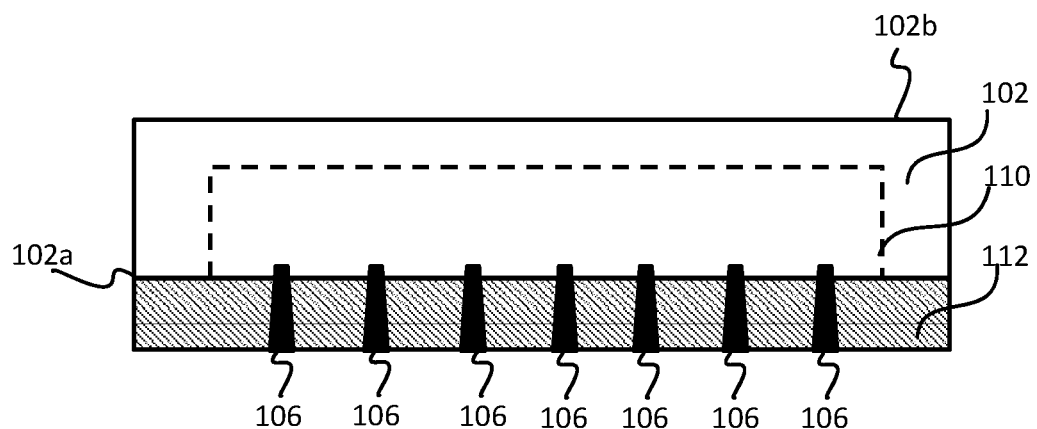
Figure 5B:
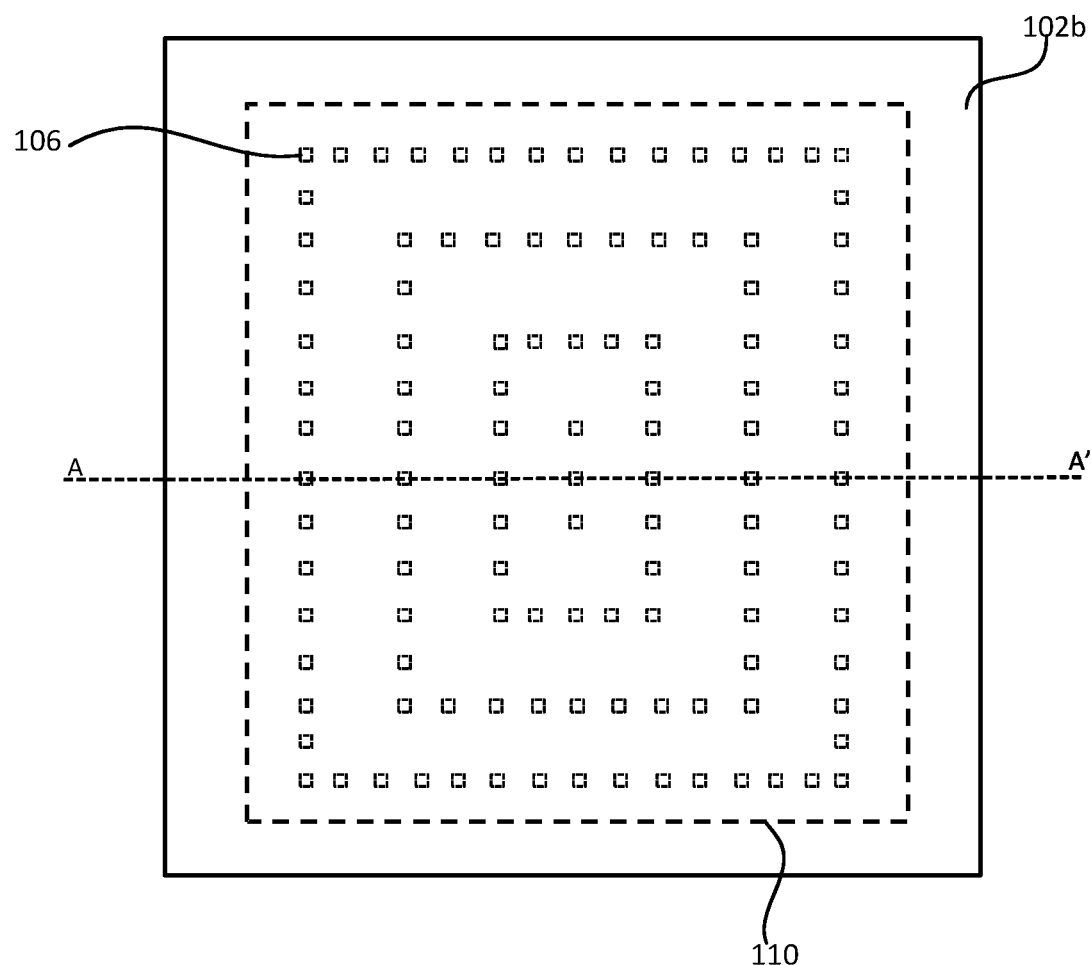

FIGS. 5A/5B illustrates a flipping process where the substrate 102 is flipped upside down and the bottom surface 102b is exposed for a subsequent substrate thinning process.

Figure 6A:
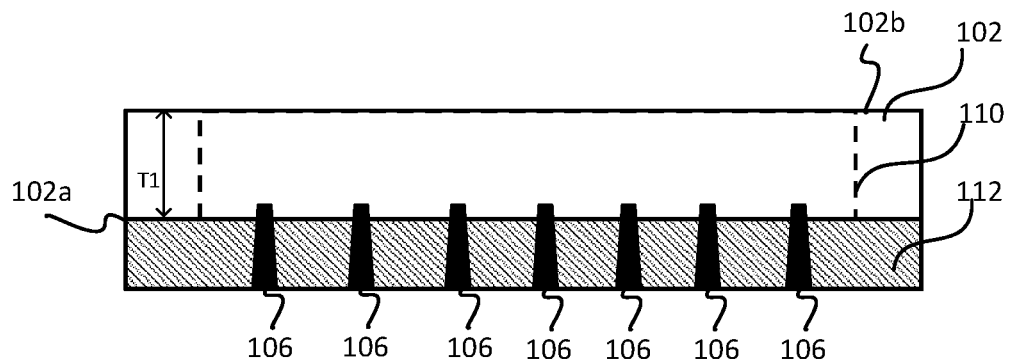
Figure 6B:
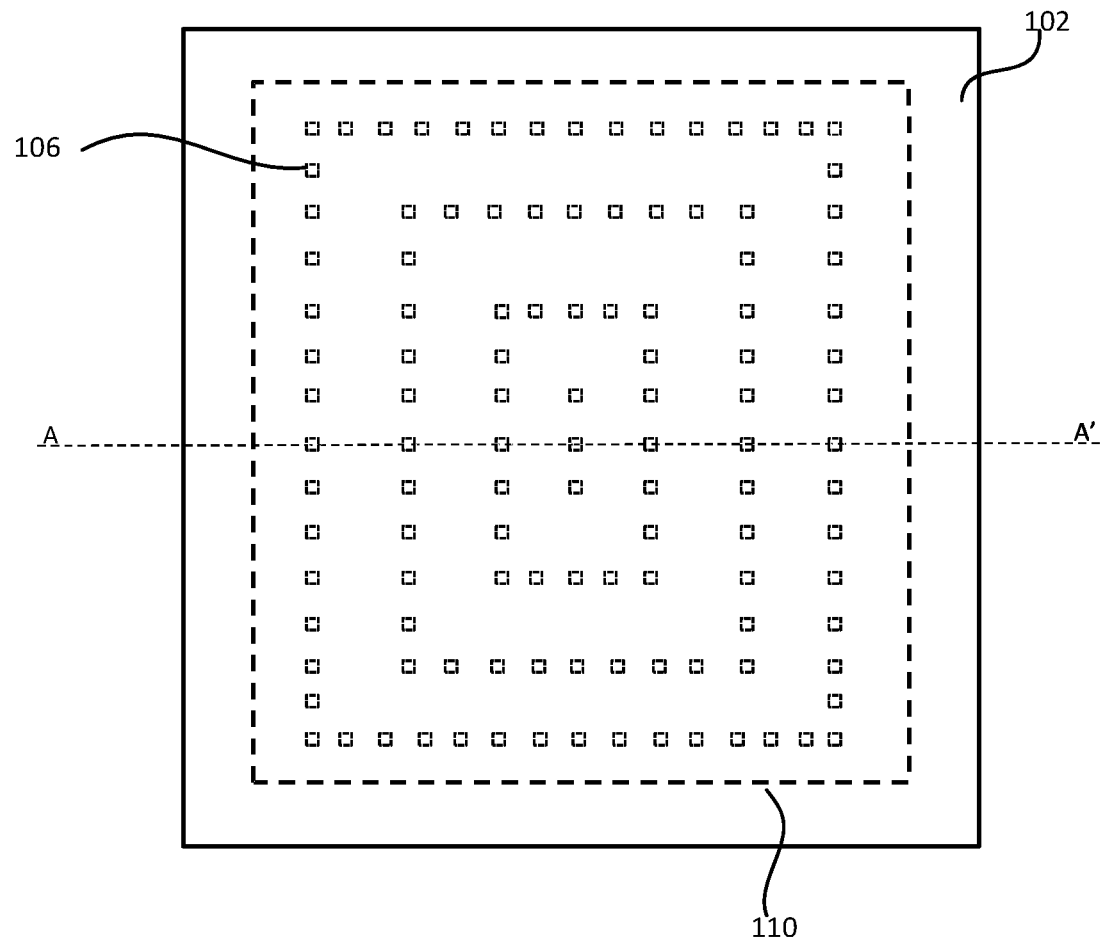

In FIGS. 6A/6B, a thinning process is introduced to remove a bottom portion of the substrate 102 from the bottom surface 102b. In some embodiments, the bottom portion of the substrate 102 that has not been doped is removed. Any suitable process can be applied to thin down the substrate 102, such as chemical mechanical polishing (CMP), etching back, or any combination thereof. After the thinning process, the substrate 102 has a thickness of T1 that is in a range from 2 um to 3 um. It should be noted that the contacts 106 are drawn with dashed lines in FIGS. 5B and 6B to indicate a perspective view of the contacts 106.

Figure 7A:
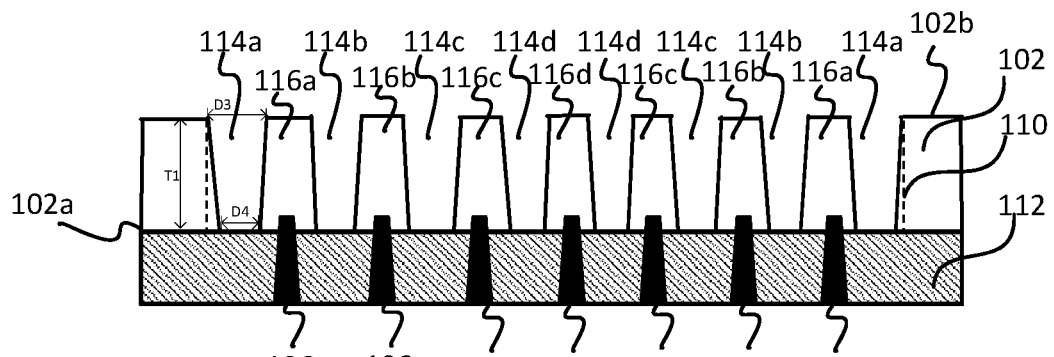
Figure 7B:
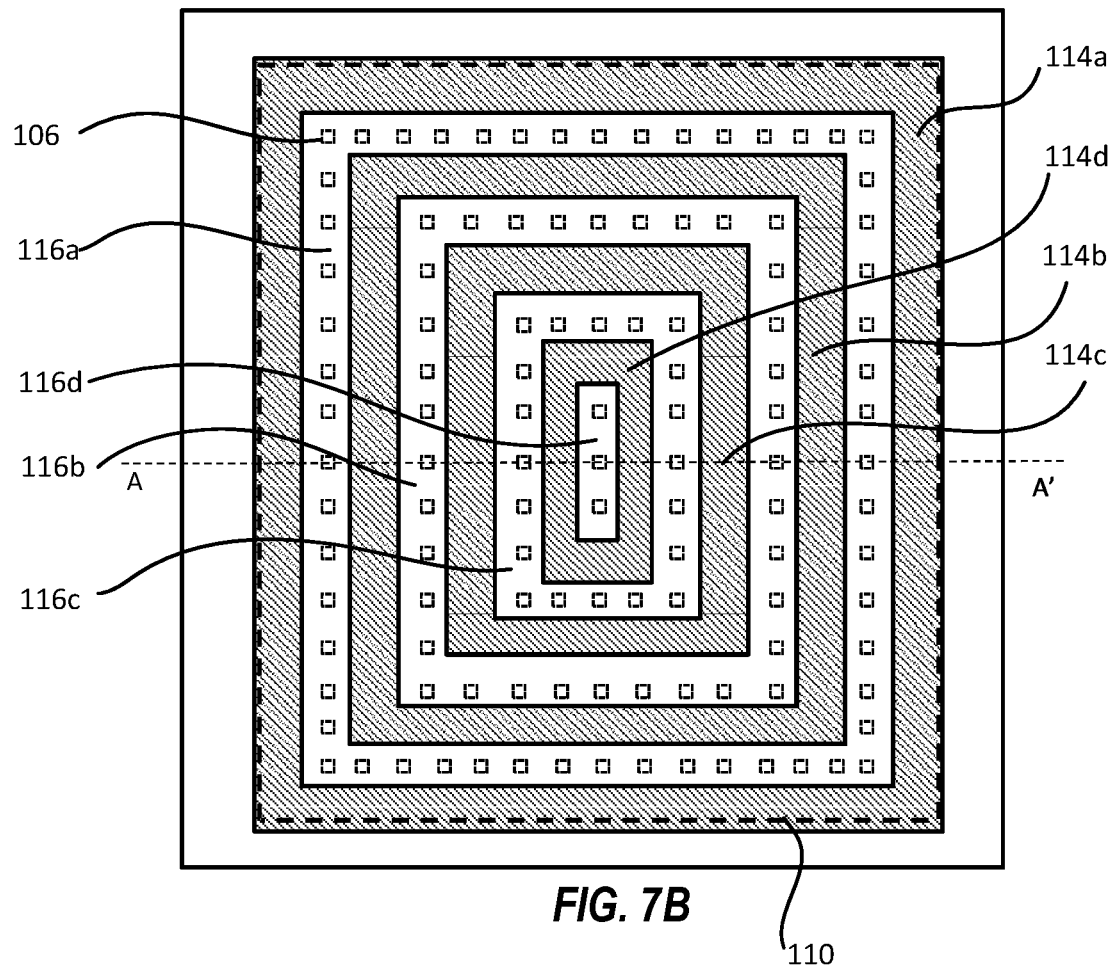

In FIGS. 7A/7B, a plurality of trenches 114 and conductive lines 116 are formed. In order to form the trenches 114 and conductive lines 116, a patterned mask stack (not shown) can be formed over the bottom surface 102b of the substrate 102 in the doped region 110. The mask stack can include one or more hard mask layers and a photoresist layer. The mask stack can be patterned according to any suitable technique, such as a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), and the like.

When the patterned mask stack is formed, an etching process, such as a wet etching or a dry etching, can be applied. The etching process etches through the substrate 102 and transfers the patterns of the mask stack into the substrate 102. Portions of the substrate that are exposed by the patterned mask stack are removed to form a plurality of trenches 114a-114d and portions of the substrate that are protected by patterned mask stack remains to form a plurality of conductive lines 116a-116d in the doped region 110. The trenches 114 expose the dielectric layer 112. The trenches 114 can have a top CD D3 in a range from 160 nm to 210 nm, a bottom CD D4 between 140 nm and 180 nm, and a height T1 from 2 um to 3 um. The trenches 114 and the conductive lines 116 are ring-shaped and alternatively disposed in the substrate 102. Moreover, the contacts 106 are aligned to land on the conductive lines 116 by the patterned mask stack.

Figure 8A:
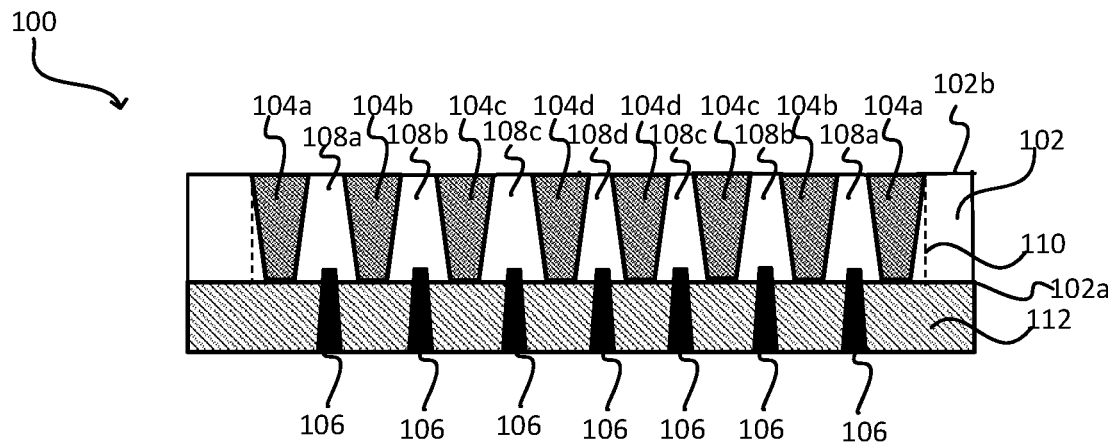
Figure 8B:
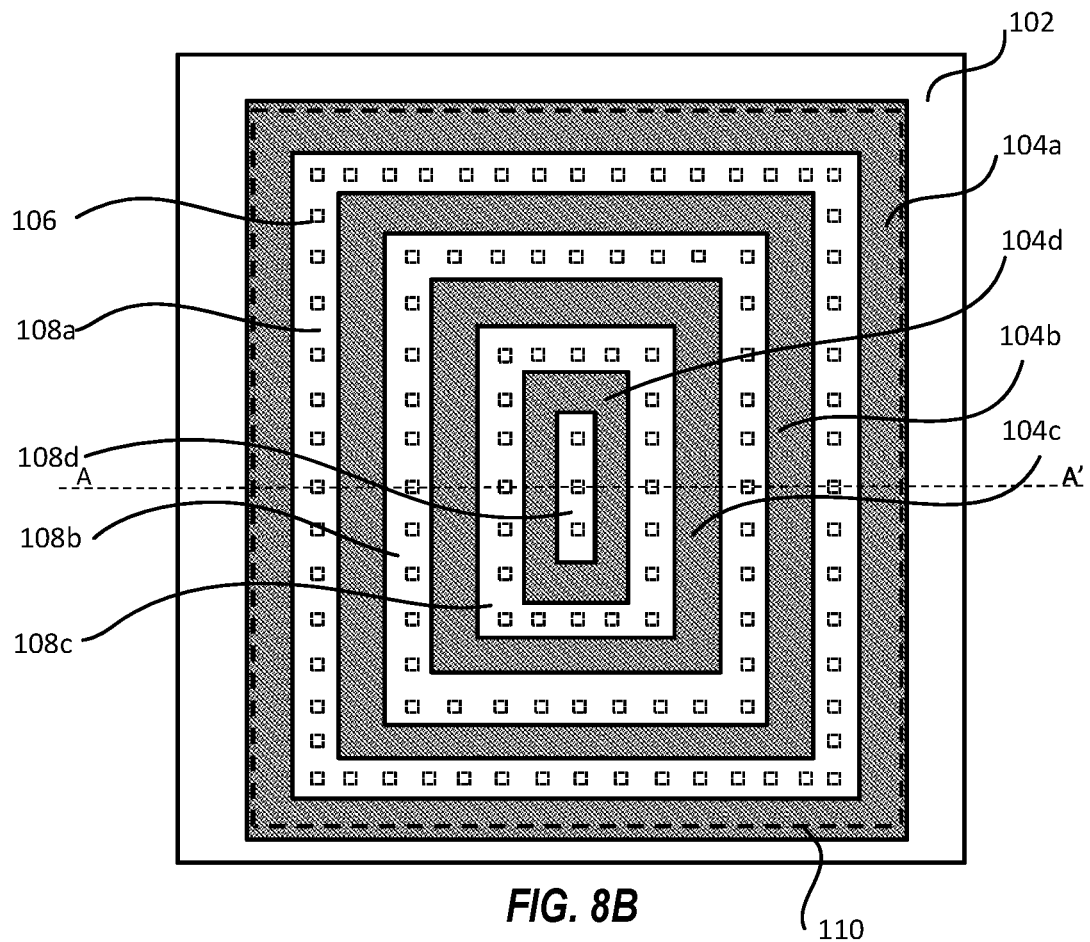

In FIGS. 8A/8B, an insulating layer (not shown) is formed to fill the trenches 114. The insulating layer further covers the bottom surface 102b of the substrate 102. The insulating layer can include SiO, SiN, SiC, SiON, SiOC, SiCN, SiOCN, AlO, AlON, ZrO, or high K material. The insulating layer can be formed by a chemical vapor deposition (CVD), a physical vapor deposition (PVD), an atomic layer deposition (ALD), a diffusion process, or any combination thereof. When the insulating layer is formed, a subsequent surface planarization process, such as a CMP process or an etching back process, can be performed to remove excessive insulating layer over the bottom surface 102b.

Upon the completion of the surface planarization, the remaining insulating layer in the trenches 114 forms the insulating structures 104, and the conductive lines 116 becomes the conductive plates 108 of the capacitor structure that are separated from each other by the insulating structure 104. The conductive plates 108 includes a first plates 108a/108c that is electrically coupled with a first polarity, and a second plates 108b/108d that is electrically coupled with a second polarity. The first conductive plates 108a/108c and the second conductive plates 108b/108d are ring-shaped and concentrically disposed in the substrate 102. The first conductive plates 108a/108c and the second conductive plates 108b/108d further extend from the top surface 102a to the bottom surface 102b. The insulating structures 104 extend from the bottom surface 102b to the top surface 102a of the substrate. The insulating structures 104 are ring-shaped and concentrically disposed between the first and the second conductive plates. A plurality of contacts 106 are formed in the dielectric layer 112. The contacts 106 pass through the dielectric layer 112 and further land on the first and second conductive plates. As shown in FIGS. 8A/8B, a complete capacitor structure 100 is formed that is identical to the capacitor structure 100 illustrated in FIGS. 1A/1B.

Figure 9:
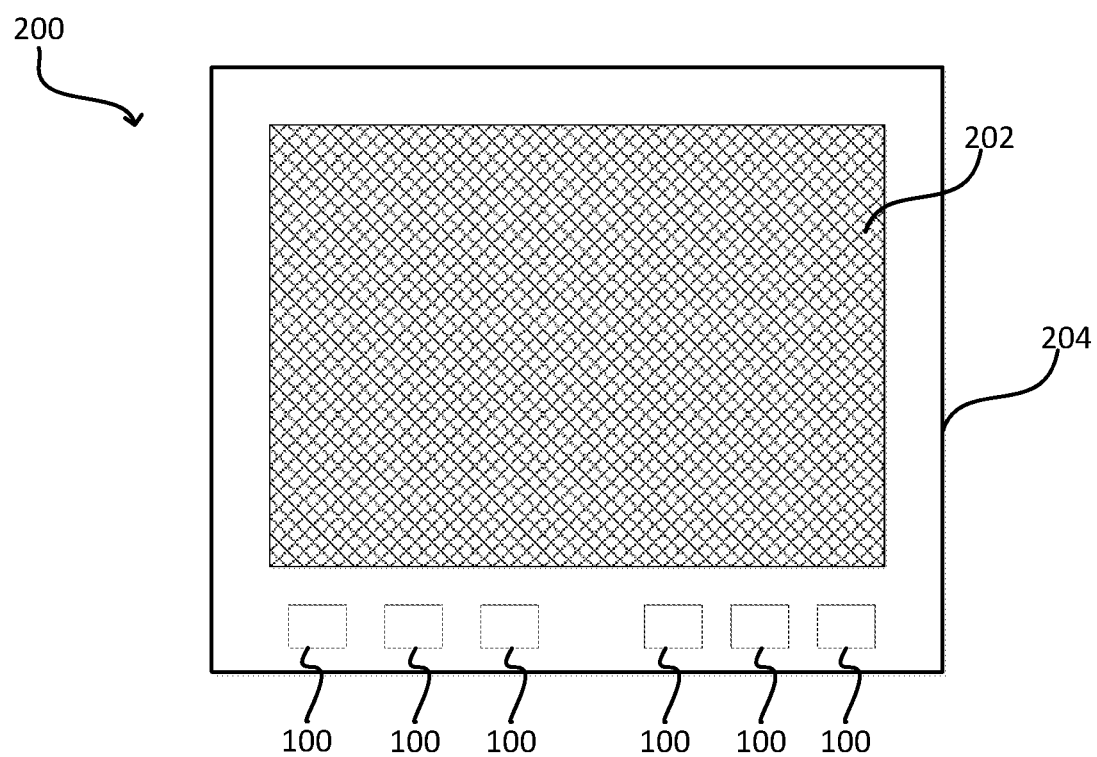
FIG. 9 is an integrated circuit chip, in accordance with exemplary embodiments of the disclosure.

FIG. 9 illustrates an integrated circuit chip 200 in accordance with an embodiment of the present disclosure. The integrated circuit chip 200 has a boundary 204, and a memory cell region 202 that is located at a first location of the integrated circuit chip 200. The memory cell region 202 can include a plurality of memory cells, such as DRAM memory cells, NAND memory cells, three dimensional (3D)-NAND memory cells, phase change memory cells, or magnetoresistive random-access memory (MRAM) cells. The integrated circuit chip 200 further includes one or more capacitor structures 100 that are adjacent to the memory cell region 202 and located at a second location of the integrated circuit chip 200. The capacitor structures are identical to the capacitor structure 100 illustrated in FIGS. 1 and 8. Each of the capacitor structures 100 and the memory cell region 202 are separated by the respective insulating structure 104a to prevent electrical interference.

Figure 10:
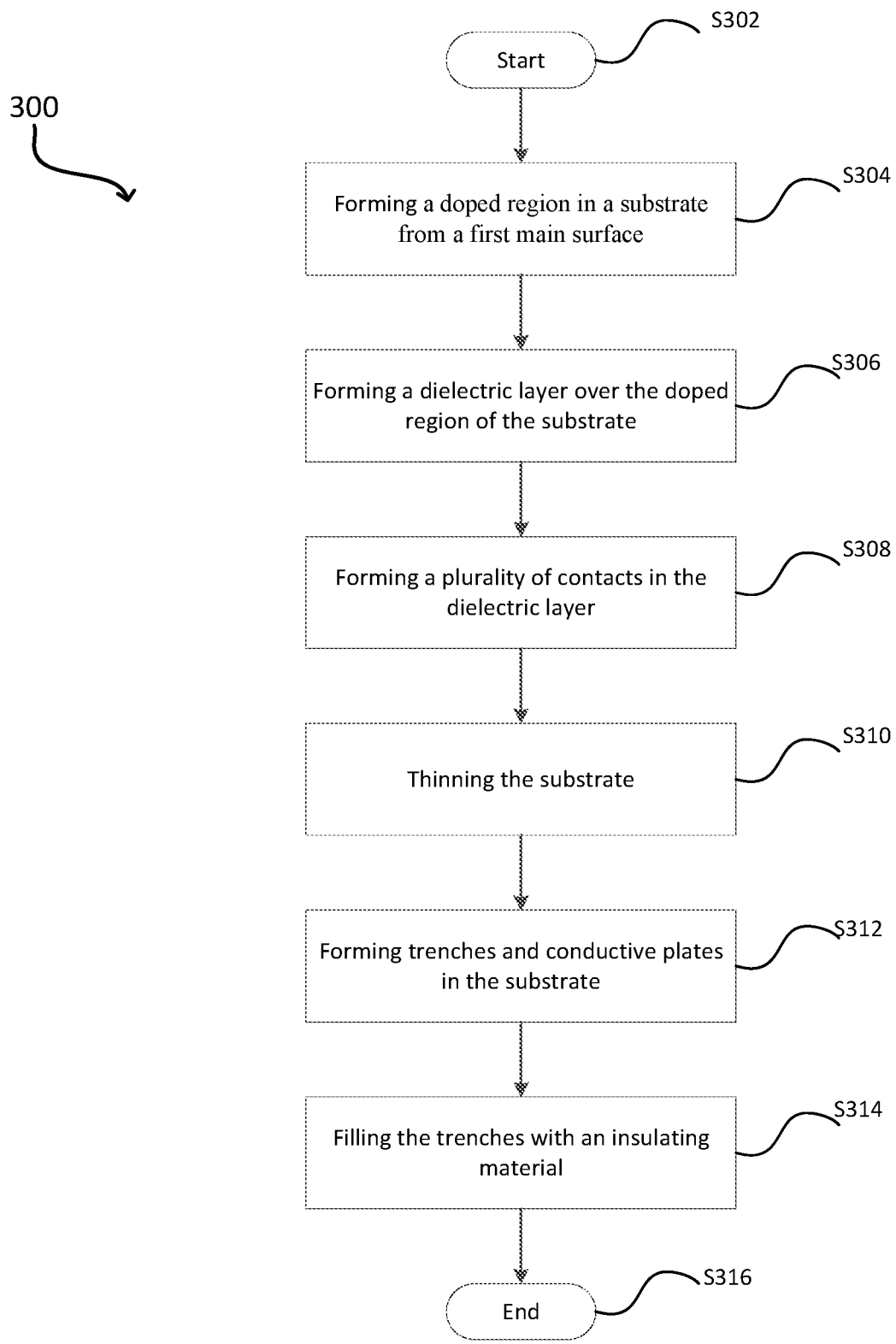
FIG. 10 is a flowchart of a process for manufacturing a capacitor structure, in accordance with exemplary embodiments of the disclosure.

FIG. 10 is a flowchart of a process 300 for manufacturing a capacitor structure in accordance with some embodiments of the present disclosure. The process 300 begins at step 304 where a doped region is formed in the substrate. The doped region can be doped with a N-type dopant or a P-type dopant. The doped region can be formed via an ion implantation process, an in situ doped epitaxial growth, a plasma doping process (PLAD), or other suitable techniques. In some embodiments, step 304 can be performed as illustrated with reference to FIGS. 2A/2B.

The process 300 then proceeds to step 306 where a dielectric layer is formed over the doped region. The dielectric layer can include SiO, SiN, SiC, SiON, SiOC, SiCN, SiOCN, AlO, AlON, ZrO, or high K material. The dielectric layer can have a thickness in a range from 5 um to 6 um. In some embodiment, step 306 can be performed as illustrated with reference to FIGS. 3A/3B.

In step 308 of the process 300, a plurality of contacts can further be formed in the dielectric layer and extends into the doped region. The contacts can have a tapered profile with a top CD in a range from 250 nm to 300 nm, a bottom CD in a range from 120 nm to 160 nm, and a height between 4.5 um to 5 um. The contacts can be made of tungsten, copper or aluminum. The contacts are ring-shaped and concentrically disposed in the doped region. In some embodiment, step 308 can be performed as illustrated with reference to FIGS. 4A/4B.

The process 300 then proceeds to step 310 where the substrate is thinned down from the bottom surface. In some embodiments, the substrate can be flipped upside down to expose the bottom surface for a thinning process. A bottom portion of the substrate that has not been doped can be removed by a CMP process, an etching back process, or a combination thereof. In some embodiment, step 310 can be performed as illustrated with reference to FIGS. 5A-6B.

In step 312 of the process 300, a plurality of trenches and conductive plates can be formed in the doped region through a combination of a photolithographic process and an etching process. A patterned mask stack can be formed over the bottom surface of the substrate in the doped region. A subsequent etching processing is introduced to etch through the substrate to transfer the pattern of the mask stack into the substrate. Portions of the substrate that are exposed by the patterned mask stack are removed to form trenches. Portions of the substrate in the doped region that are protected by the patterned mask stack remains to function as the conductive plates. The trenches and the conductive plates are ring-shaped, alternatively disposed, and concentrically arranged in the doped region. In some embodiment, step 312 can be performed as illustrated with reference to FIGS. 7A/7B.

The process 300 then proceeds to step 314 where an insulating layer is formed to fill the trenches. The insulating layer further covers the bottom surface of the substrate. A subsequent surface planarization process, such as a CMP process or an etching back process, can be performed to remove excessive insulating layer over the bottom surface. Upon the completion of the surface planarization, the remaining insulating layer in the trenches forms the insulating structures, and the final capacitor structure is completed.

The final capacitor structure includes a plurality of first conductive plates that is electrically coupled with a first polarity, and a plurality of second conductive plates that is electrically coupled with a second polarity. The first conductive plates and the second conductive plates are ring-shaped and concentrically disposed in the doped region of the substrate. The first conductive plates and the second conductive plates further extend from the top surface to the bottom surface of the substrate. The insulating structures extend from the bottom surface to the top surface of the substrate. The insulating structures are ring-shaped and concentrically disposed between the first and the second plates. A plurality of contacts are formed in the dielectric layer. The contacts pass through the dielectric layer and further extend into the first and second conductive plates. In some embodiment, step 314 can be performed as illustrated with reference to FIGS. 8A/8B.

It should be noted that additional steps can be provided before, during, and after the process 300, and some of the steps described can be replaced, eliminated, or performed in different order for additional embodiments of the process 300. In subsequent process steps, various additional interconnect structures (e.g., metallization layers having conductive lines and/or vias) may be formed over the semiconductor device 100. Such interconnect structures electrically connect the semiconductor device 100 with other contact structures and/or active devices to form functional circuits. Additional device features such as passivation layers, input/output structures, and the like may also be formed.

The various embodiments described herein offer several advantages over related examples. For example, the conventional metal-oxide-silicon (MOS)/metal-oxide-metal (MOM) capacitors typically require a large silicon area. A large MOS capacitor area could increase the time-dependent dielectric breakdown (TDDB) failure rate. In the present disclosure, a vertical-style capacitor structure is formed in the substrate. The capacitor structure has a silicon-dielectric-silicon configuration where the plates of the capacitor structure are made of portions of substrate. The capacitor structure can be formed in a spare region of the silicon substrate. The plates of the capacitor structure extend from a top surface to a bottom surface of the substrate, and have a concentric profile that provides high capacitance density and occupy less chip area. The plates of the capacitor structure are spaced apart by an insulating structure that extends from the top surface to the bottom surface of the substrate. The insulating structure further separates the capacitor structure from adjacent active memory cells to prevent electrical interference. The capacitor structure of the present disclosure provides high capacitance density, occupies less chip area, prevents electrical failure, and meets the scaling requirement.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a doped region in a substrate from a first main surface;
   forming an insulating layer over the doped region of the substrate;
   forming contacts in the insulating layer, the contacts extending into the doped region,
   removing a portion of the substrate from a second main surface;
   forming a trench, a first conductive line and a second conductive line from the doped region of the substrate through etching the substrate from the second main surface, wherein the trench extends through the substrate to expose the insulating layer, the first and second conductive lines are spaced apart from each other by the trench, and the contacts are positioned along and in contact with the first and second conductive lines; and
   filling the trench with a dielectric material.

2. The method of claim 1, further comprising:
   performing a surface planarization process to remove excessive dielectric material over the second main surface of the substrate such that the dielectric material remaining in the trench forms an insulating structure.

3. The method of claim 1, wherein the removing the portion of the substrate comprises removing the portion of the substrate that has not been doped.

4. The method of claim 1, wherein the forming the doped region in the substrate from the first main surface comprises directing a beam of ions onto the first main surface of the substrate to form the doped region in the substrate.

5. The method of claim 2, wherein at least one of the first and second conductive lines and the insulating structure are close-shaped, and are concentrically arranged in the substrate.

6. The method of claim 1, wherein
   the first conductive line is formed from the doped region and electrically coupled with a first polarity, and
   the second conductive line is formed from the doped region and electrically coupled with a second polarity.

7. The method of claim 1, wherein the forming the trench, the first conductive line, and the second conductive line comprise:
forming a patterned mask stack over the doped region, the patterned mask stack including patterns; and
etching the doped region by transferring the patterns into the doped region to form the trench, the first conductive line and the second conductive line being formed from remaining portions of the doped region.

8. The method of claim 5, wherein the insulating structure and the first and second conductive lines are tapered and interlaced.

9. The method of claim 8, wherein each of the first and second conductive lines comprises a first critical dimension (CD) at the first main surface and a second CD at the second main surface, the first CD being larger than the second CD.

10. The method of claim 9, wherein the insulating structure includes a top CD at the first main surface and a bottom CD at the second main surface, the top CD being smaller than the bottom CD.

11. The method of claim 1, wherein the contacts are tapered such that each of the contacts includes a top surface and a bottom surface, the top surface including a top critical dimension (CD) level with a first surface of the insulating layer, and the bottom surface including a bottom CD and extending through a second surface of the insulating layer that is in contact with the substrate, the top CD being larger than the bottom CD.

12. The method of claim 1, wherein the contacts are formed along the first and second conductive lines, and further extend into the first and second conductive lines.

13. A method for manufacturing an integrated circuit chip, comprising:
forming a doped region in a substrate from a first main surface, the substrate having an opposing second main surface;
forming a transistor at a first location of the first main surface of the substrate; and
forming a capacitor at a second location of the substrate, the capacitor comprising:
a first conductive line and a second conductive line that are formed from the doped region of the substrate and extends from the first main surface to the second main surface of the substrate;
an insulating structure that is formed between the first and second conductive lines and extends from the first main surface to the second main surface; and
contacts formed in a dielectric layer and arranged along the first and second conductive lines, the dielectric layer being formed over the first main surface of the substrate, the contacts extending through the dielectric layer and into the first and second conductive lines.

14. The method of claim 13, wherein the forming the capacitor further comprises:
forming the dielectric layer over the doped region of the substrate;
forming the contacts in the dielectric layer to extend through the dielectric layer and into the dope region of the substrate;
removing a portion of the substrate from a second main surface;
forming a trench in the doped region of the substrate by etching the substrate from the second main surface, wherein the trench extends through the substrate to expose the dielectric layer, and the first and second conductive lines are formed from remaining portions of the doped region; and
filling the trench with a dielectric material.

15. The method of claim 14, further comprising:
performing a surface planarization process to remove excessive dielectric material over the second main surface of the substrate such that the dielectric material remaining in the trench forms the insulating structure.

16. The method of claim 14, wherein the removing the portion of the substrate comprises removing the portion of the substrate that has not been doped.

17. The method of claim 13, wherein at least one of the first and second conductive lines and the insulating structure are close-shaped, and are concentrically arranged in the substrate.

18. The method of claim 13, wherein the first conductive line is electrically coupled with a first polarity and the second conductive line is electrically coupled with a second polarity.

19. The method of claim 15, wherein:
each of the first and second conductive lines includes a first critical dimension (CD) at the first main surface and a second CD at the second main surface, the first CD being larger than the second CD, and
the insulating structure includes a top CD at the first main surface and a bottom CD at the second main surface, the top CD being smaller than the bottom CD.

20. The method of claim 13, wherein the insulating structure and the first and second conductive lines are tapered and interlaced.

* * * * *